United States Patent [19]

MacKay

[11] Patent Number: 5,076,485
[45] Date of Patent: *Dec. 31, 1991

[54] BONDING ELECTRICAL LEADS TO PADS WITH PARTICLES

[75] Inventor: Colin A. MacKay, Austin, Tex.

[73] Assignee: Microelectronics and Computer Technology Corporation, Austin, Tex.

[ * ] Notice: The portion of the term of this patent subsequent to Feb. 26, 2008 has been disclaimed.

[21] Appl. No.: 631,296

[22] Filed: Dec. 20, 1990

Related U.S. Application Data

[63] Continuation-in-part of Ser. No. 513,504, Apr. 24, 1990, Pat. No. 4,995,551.

[51] Int. Cl.[5] .............................................. H05K 3/32
[52] U.S. Cl. .................................. 228/177; 228/180.2; 228/248; 156/276; 156/297
[58] Field of Search ..................... 228/177, 180.2, 203, 228/248; 29/857, 860, 875; 156/276, 297

[56] References Cited

U.S. PATENT DOCUMENTS

| | | | |
|---|---|---|---|
| 3,303,393 | 2/1967 | Hymes et al. | 317/101 |
| 3,382,568 | 5/1968 | Kuiper | 29/578 |
| 3,401,055 | 9/1968 | Langdon et al. | 117/212 |
| 3,731,377 | 5/1973 | Muckelroy | 29/626 |
| 3,900,153 | 8/1975 | Beerwerth et al. | 228/246 |
| 4,332,341 | 6/1982 | Minetti | 228/180 |
| 4,410,774 | 11/1968 | Barson et al. | 204/1093 |
| 4,442,966 | 4/1984 | Jourdain et al. | 228/123 |
| 4,604,644 | 8/1986 | Beckham et al. | 357/80 |
| 4,749,120 | 6/1988 | Hatada | 228/123 |
| 4,763,409 | 8/1988 | Takekawa et al. | 29/827 |
| 4,776,509 | 10/1988 | Pitts et al. | 228/179 |
| 4,845,335 | 7/1989 | Andrews et al. | 219/121.63 |
| 4,995,551 | 2/1991 | MacKay | 228/180.2 |

OTHER PUBLICATIONS

Totta et al, "SLT Device Metallurgy and Its Monolithic Extension", IBM Journal of Research Development, pp. 226–238 (May, 1969).

Miller, "Controlled Collapse Reflow Chip Joining", IBM Journal of Research Development pp. 239–250 (May, 1969).

Hatada et al, "New Film Carrier Assembly Technology" Transferred Bump Tab, IEEE Transactions on Components, Hybrids, and Manufacturing Technology, vol. CHMT-10, No. 3, pp. 335–340 (Sep., 1987).

Hatada et al, "Application to the Electronic Instrument by Transferred Bump-TAB Technology", Proceedings of the 1987 International Symposium on Microelectronics, pp. 649–653 (Sep. 1987).

Hatada et al, "Application to the Electronic Instrument by Transferred Bump-TAB Technology", Proceedings of the Third IEEE/CHMT International Electronic Manufacturing Technology Symposium, pp. 81–86 (Oct., 1987).

Hatada et al, "Bump Property for High Bondability and Reliability in Transferred Bump Tab Assembly Technology", IMC 1988 Proceedings, pp. 440–443, (May 1988).

*Primary Examiner*—Samuel M. Heinrich
*Attorney, Agent, or Firm*—David M. Sigmond

[57] ABSTRACT

Bonding a plurality of TAB tape leads to electrical pads in and aligned with the surface of a die by covering the pads with a plurality of electrically conductive particles, aligning the electrical leads with the particles and the pads, and simultaneously bonding the particles to the pads and the electrical leads to the particles so that each bonded particle is between and in contact with a pad and a lead. Preferably the particles are solid spheres 1.0 mils in diameter. The spheres may be applied by covering the entire surface with the spheres, covering the pads with an adhesive material prior to the spheres, or covering the pads with a mixture of vehicle and spheres.

36 Claims, 7 Drawing Sheets

BONDING ELECTRICAL LEADS TO PADS WITH PARTICLES

CROSS REFERENCE TO RELATED APPLICATIONS

This is a continuation-in-part of copending U.S. application Ser. No. 07/513,504 filed Apr. 24, 1990 now U.S. Pat. No. 4,995,551.

BACKGROUND OF THE INVENTION

The present invention is directed to a method of bonding a plurality of electrical leads to a plurality of pads or electrical contacts aligned with a surface of an electrical component. And more particularly, the present method is directed to bonding a plurality of electrical leads of a TAB tape to a plurality of electrical contacts or pads on the surface of an integrated circuit die or chip without requiring bumps on the die, bumps on the leads, or transfer bumps.

It is conventional to bond tape automated bonding (TAB) tape having a plurality of electrical leads to integrated circuit dies by thermocompression bonding such as shown in U.S. Pat. No. 4,776,509 or laser bonding as shown in U.S. Pat. No. 4,845,335. However, such bonding generally requires the use of a bump on the electrical pads or contacts of the integrated circuit die and/or on the electrical TAB leads.

The present invention is directed to a method for providing contact bumps necessary to prevent contact beam leads or other substrate circuitry from touching the semiconductor silicon surface of a die. This simpler, easier, and more cost effective method of bonding eliminates the cost, possible wafer loss in processing, and the capital cost of an electroplating bumping line for plating bumps on wafers to be bonded. The present invention is particularly well suited for flip chip bonding.

SUMMARY

The present invention is directed to a method of bonding a first plurality of electrical leads to a second plurality of electrical pads or contacts on a surface of an electronic component. The method includes covering each pad with a plurality of electrically conductive particles, aligning the electrical leads with the particles and pads, and simultaneously bonding the particles to the pads and the aligned electrical leads to the particles so that the bonded particles are between and connected to a pad and a lead.

The method further includes pre-aligning the electrical leads with the pads, covering the surface of the electrical component with a plurality of electrically conductive particles, aligning the pre-aligned electrical leads with the particles and the pads, simultaneously bonding the particles to the pads and the aligned electrical leads to the particles so that each bonded particle is between and in contact with a pad and a lead, and then removing the unbonded particles off the surface of the electrical component.

Still a further feature of the present invention is wherein the maximum size of the particles is no greater than one-half of the width of the pads for insuring a good bonding contact. Preferably the particles are solid spheres or solid right circular cylinders.

Another object of the present invention is wherein the particles extend at least 0.5 mils over the underlying pads.

An additional object of the present invention is wherein the pads are in and aligned with an essentially smooth top surface of an electronic component.

Yet a further object of the present invention is the provision of a method of covering each pad with a plurality of particles by enclosing the pads and the surface of the electrical component with a retaining lip for holding the particles on the surface and on the pads prior to and during bonding.

A still further object of the present invention is the provision of another embodiment of applying the conductive particles to the pads which includes covering the pads with an adhesive material prior to covering the pads with particles whereby the particles will adhere to the pads. The adhesive may be applied to the pads by (1) using a mask exposing only the pads prior to covering the pads with an adhesive material, (2) covering the pads with an adhesive material by syringe, (3) simultaneously covering a plurality of pads with adhesive by piston and tube assembly having a plurality of openings and alignment with the pads, or (4) covering the pads with adhesive by screen printing. If desired, all of these embodiments may include covering the pads in a single step with a vehicle, such as an adhesive, mixed together with the electrically conductive particles.

Yet a further object of the present invention is wherein the pads are bonded to the particles and the particles are bonded to the leads by thermocompression bonding, thermosonic bonding, or laser bonding; or adhesive bonding when adhesive is applied to the pads and the leads.

Yet still a further object of the present invention is the provision of a method of bonding a plurality of electrical leads of a TAB tape to a plurality of electrical contacts on a surface of an integrated circuit die. The method includes enclosing the contacts and the surface of the die with a retaining lip, covering the contacts and the surface within the retaining lip with a single layer of solid electrically conductive particles, such as spheres or right circular cylinders, simultaneously bonding the leads of the TAB tape to the particles on the contacts and bonding the particles on the contacts to the contacts so that each bonded particle is between and in connected to a contact and a lead, and then removing the unbonded particles from the surface. Preferably, the height of the lip is approximately one-half of the diameter of the particles.

Other and further objects, features and advantages will be apparent from the following description of presently preferred embodiments of the invention, given for the purpose of disclosure, and taken in conjunction with the accompanying drawings.

DESCRIPTION OF THE PREFERRED EMBODIMENT

While the present invention will be described, for the purpose of illustration only, of bonding of tape-automated-bonding (TAB) lead frames to integrated circuit dies, the present method of bonding is applicable to bonding other types of electrical leads to electrical pads or contacts in which the pads or contacts are aligned with the surface of an electrical component.

Figure 1:
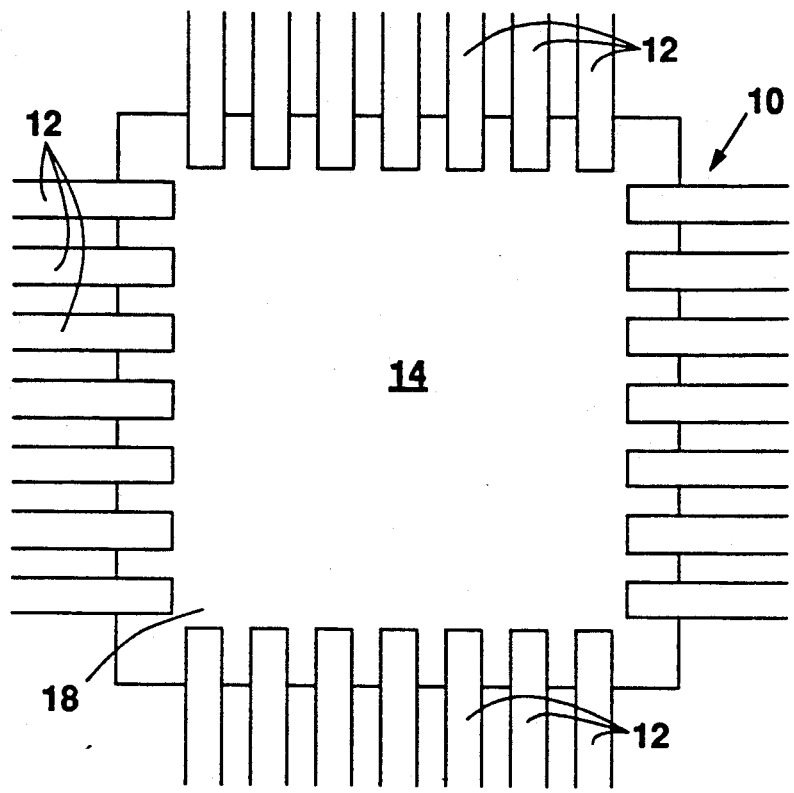
FIG. 1 is an elevational top view of the electrical leads of a TAB tape bonded to an integrated circuit die.
Figure 1A:
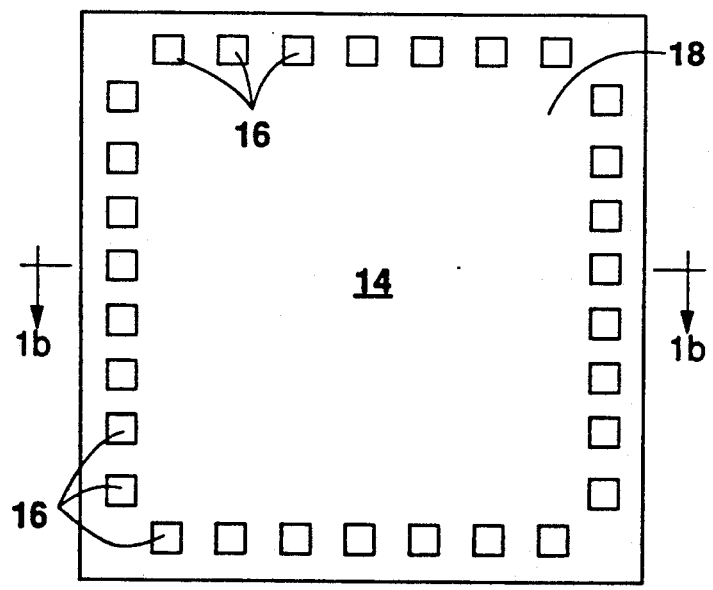
FIG. 1a is an elevational view of an integrated circuit die with electrical contacts or pads in the surface.
Figure 1B:
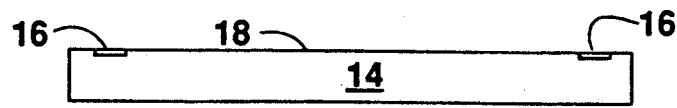
FIG. 1b is a cross-sectional view taken along the line 1b—1b of FIG. 1a, FIG. 1c is a cross-sectional view of the die of FIG. 1b showing the step of pre-aligning electrical TAB leads to pads of the die.

Referring now the the drawings, particularly to FIG. 1, the reference numeral 10 generally indicates a portion of a TAB tape having a plurality of inner leads 12 for bonding to an integrated circuit die or chip 14 having active semi-conductor circuitry. As best shown in FIGS. 1a and 1b, the integrated circuit die 14 includes a top surface 18 having therein a plurality of electrical pads or contacts 16. In the example set forth, the pads or contacts 16 have their tops in and aligned with the surface 18 of the die 14 within the normal limits of conventional semiconductor technology. However, it is understood that the present invention is well suited to pads which protrude above a surface of a component, as well as pads which may lay in recesses of a component (as would be the case for an integrated circuit with a 700 Angstrom layer of passivation above the pads). Presently, in typical TAB-die connections, the pads or contacts 16 are square with each side approximately 4.4 mils long and the leads 12 are 1.3 mils thick and 3 mils wide. However, these sizes are presently becoming smaller and therefore the difficulty of, importance of, and expense of bonding the leads 12 to the pads 16 become more important. While the type of materials used in the leads 12 and 16 may vary, conventionally, the pads 16 are aluminum and the leads 12 may be copper which are gold or tin covered.

Normally, bumps are provided on the top of the pads 16 and/or on the ends of the leads 12 and attached thereto prior to bonding. Such bonding bumps are expensive, result in possible wafer loss in processing and require a considerable capital cost for an electro-plating bumping line for plating bumps on the wafers. As an alternative, it has been suggested to form the bumps on a separate substrate and thereafter transfer the bumps to the electrical leads before bonding to the pads. The prior art has also suggested forming bumps from a random suspension of fine conducting powder in an adhesive, for instance silver powder loading with 0.1 micron silver particles.

Instead, the present invention uses a single layer of electrically conductive particles, formed of a suitable material such as copper, gold, silver or nickel which may be coated with tin, tin/lead or gold. Preferably the particles are shaped as spheres or right circular cylinders with a diameter of at least 0.5 mils; however, the particles may be other shapes or even powder.

Figure 1C:
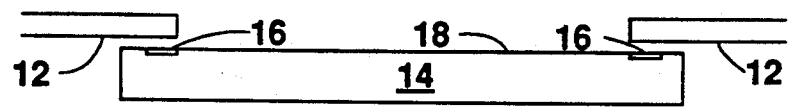
FIG. 1d is a cross-sectional view similar to FIG. 1c showing the step of retracting the electrical TAB leads from the die after they are pre-aligned.
FIG. 1e is a cross-sectional view similar to FIG. 1d showing a step of adding a lip around the circumference of the surface of the die.
FIG. 1f is a cross-sectional view similar to FIG. 1e with the additional step of inserting a layer of electrically conductive particles on the surface of the die and covering the pads.
FIG. 1g is a cross-sectional view similar to FIG. 1f showing the next step of the process of aligning the pre-aligned electrical TAB leads to contact the particles over the pads of the die.
FIG. 1h is a view similar to FIG. 1g showing the next step in the process of bonding by bonding the electrical leads to the particles on the pads and bonding the particles on the pads to the pads.
FIG. 1i is a view similar to FIG. 1h showing the finished product with the excess particles and the retaining lip removed from the surface of the die.
Figure 1D:
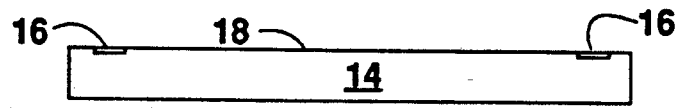
Figure 1E:
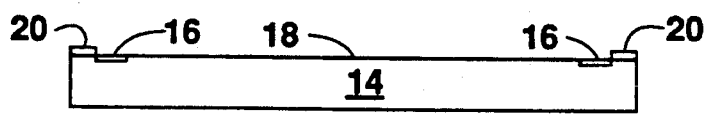
Figure 1F:
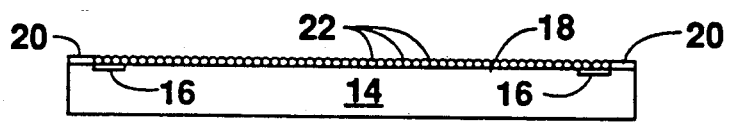

Referring to FIGS. 1c through 1i, the preferred embodiment of the process of bonding the electrical leads 12 to the pads 16 of the die or chip 14 is best seen. In this embodiment where the entire surface 18 of chip 14 is covered with particles 22, it is necessary to pre-align once covered with particles 22 the pads 16 will no longer be visible. As shown in FIG. 1c, leads 12 are pre-aligned with pads 16, and then retracted as seen in FIG. 1d. Referring now to FIG. 1e, a retainer lip 20 is provided, by any suitable means, around the outer periphery of the top 18 of the die or chip 14 and outside of the pads or contacts 16. Retainer lip 20 can be, for example, a flexible metal strip, a wire, or even suitable masking tape could be used. Thereafter, as best seen in FIG. 1f, a single layer of electrically conductive particles 22 is placed on the top 18 of the die 14 within the retaining lip 20. The particles 22 cover the entire surface 18 of the chip 14 including all of the pads 16. While it is preferred that the particles 22 be solid metallic spheres or right circular cylinders, they can be other shapes so long as they adequately cover the pads 16 for providing a good electrical bond therebetween. However, it is desirable to deposit particles have an outside size of no greater than one-half of the width of the pads 16 in order to ensure good contact between the pads 16 and the spheres 22. For example only, the diameter of spheres 22 is preferably between 0.5 to 1.5 mils, and more preferably 1.0 mils.

Figure 1G:
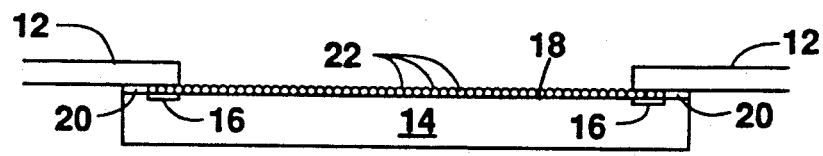

After the placement of the spheres 22 on the surface 18 of the chip 14, the pre-aligned electrical leads 12 are aligned over the pads 16 as best seen in FIG. 1g. It is to be noted that the placement of the leads 12 over the pads 16 encloses a plurality of spheres 22 between the leads 12 and the pads 16. At this point, it is to be noted that preferably the thickness of the retainer lip 20 should be approximately one-half of the overall size or diameter of the spheres 22. Thus, the lip 20 will not prevent the contact of the ends of the leads 12 with the spheres 22.

Figure 1H:
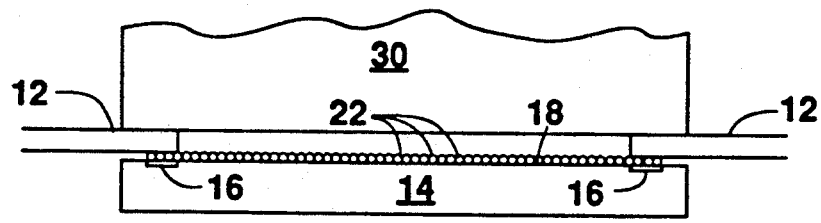

As best seen in FIG. 1h, suitable bonding means 30 is provided for simultaneously bonding the leads 12 of the TAB tape to the spheres 22 which are positioned on the pads 16 and also bonding the spheres 22 which are on the pads 16 to the pads 16. As shown, the bonding apparatus 30 may be any suitable bonding apparatus such as a laser or, as shown here, as a conventional thermosonic or thermocompression bonding machine which simultaneously bonds all of the leads 12 to the pads 16. When using thermosonic or thermocompression bonding aluminum pads 16 with particles 22 composed of gold or copper, it is desirable to form a thin barrier layer of electroless or electrolytic nickel over aluminum pads 16 prior to bonding to prevent the formation of AlAu or AlCu intermetallic compounds which may adversly affect reliability. The details of laser bonding electronic contacts are known to those with skill in the art and will not be repeated herein; see, for example, U.S. Pat. No. 4,845,335 and U.S. application Ser. Nos. 07/405,377 and 07/558,127, the disclosures for which are hereby incorporated by reference.

Figure 1I:
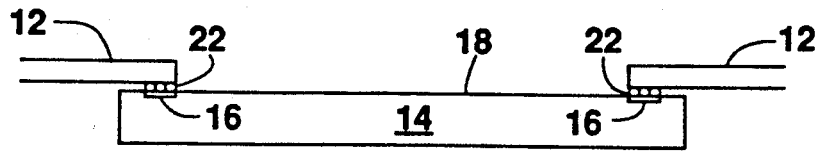

After bonding, as best seen in FIG. 1i, the bonding apparatus 30 is removed, the excess particles or spheres 22 are removed or shaken off of the surface 18 of the chip 14 for reuse, and if desired, the retaining lip 20 may be removed. Each bonded particle 22 is between and in contact with a lead 12 and a pad 16. That is, the bonded particles 12 form a single layer between each lead and pad at most one particle deep.

In the previously described embodiment it was necessary to pre-align leads 12 with pads 16 in order to align leads 12 with pads 16 after surface 18 was covered with particles 22 since pads 16 were no longer visible. In the remaining embodiments to be described, however, it is no longer necessary to pre-align leads 12 with pads 16 since particles 22 will be applied to selectively cover pads 16 without covering all of surface 18 of die 14.

Figure 2:
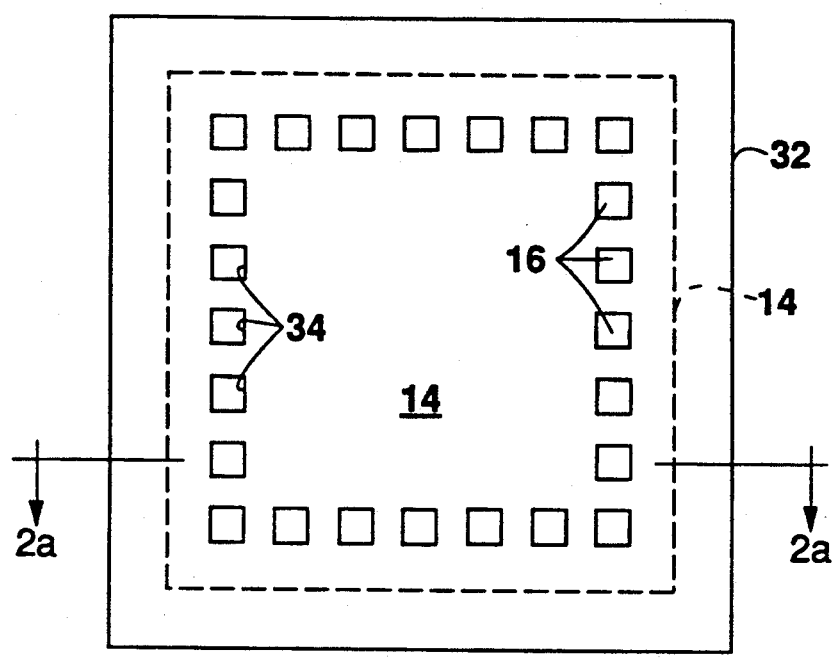
FIG. 2 is a top elevational view of the first step of bonding leads to a die using a mask in another embodiment of the process of the present invention.
Figure 2A:
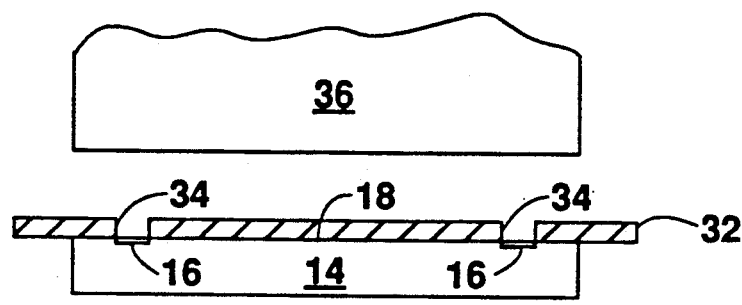
FIG. 2a is a cross-sectional view taken along the line 2a—2a of FIG. 2 including the positioning of an adhesive dispenser over the mask on a die.
Figure 2B:
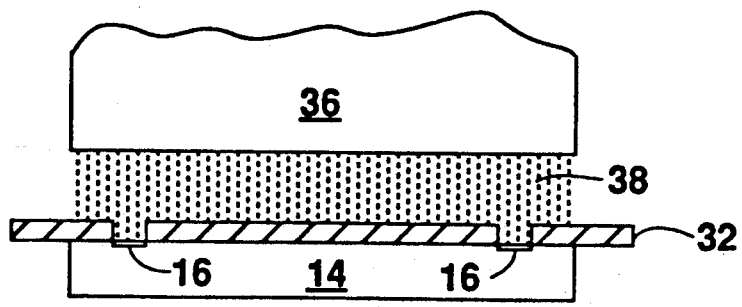
FIG. 2b is a view similar to FIG. 2a showing the dispersal of adhesive onto the pads of the die through a mask.
Figure 2C:
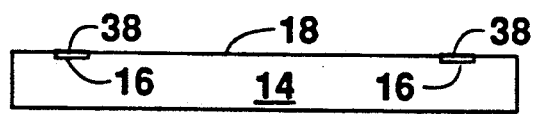
FIG. 2c is a view similar to FIG. 2b, but showing the removal of the mask leaving only an adhesive on the pads of the die.
Figure 2D:
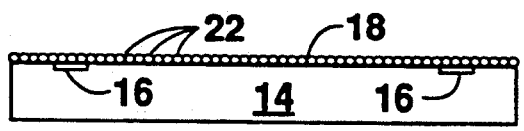
FIG. 2d is a view similar to FIG. 2c, showing the application of electrical particles to the surface of the die.
Figure 2E:
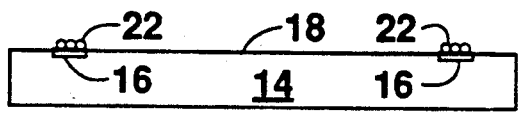
FIG. 2e shows the removal of the excess particles leaving particles stuck in place on the pads of the die.
Figure 2F:
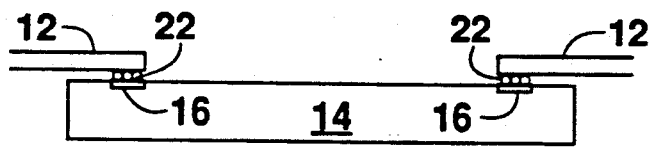
FIG. 2f illustrates the alignment of the electrical leads over the stuck particles and pads of the die.
Figure 2G:
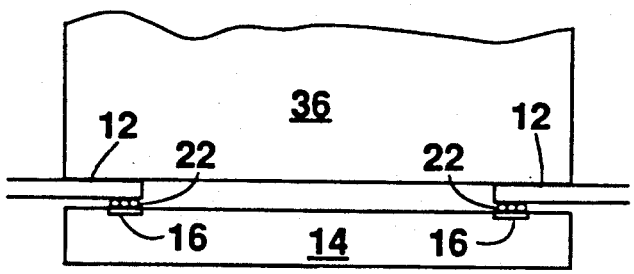
FIG. 2g is a view similar to FIG. 2f showing the bonding of the leads to the particles and the particles to the pads of the die.
Figure 2H:
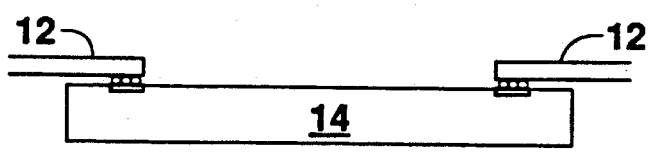
FIG. 2h is a cross-sectional view of the finished bonding of the leads to the die.

Referring now to FIGS. 2 through 2h, another embodiment of the present invention is best seen in which a mask 32 is provided having openings 34 which are aligned with the pads 16. Thus, in FIG. 2 and 2a the mask 32 is positioned on the top surface 18 of the chip or die 14 with the openings 34 aligned with the pads or contacts 16. A suitable sprayer or dispenser 36 is positioned above the mask 32 and, as best seen in FIG. 2b, dispenses a spray of adhesive material onto the mask 32 which protects the top 18 of the die 14, but allows the adhesive to pass through the openings 34 and adhere to the top of the pads 16. Any type of adhesive may be used such as an activated solder paste, a dilute solution of abietic acid, for example, a 10 to 20 percent solution, a cellulose solution or a sugar solution.

Referring now to FIG. 2c, the mask 32 has been removed leaving the pads 16 covered with a thin adhesive solution 38 on the top of the pads 16 but not on the remainder of the surface 18 of the die 14. In FIG. 2d, a plurality of electrically conductive particles or spheres 22 are dispensed upon the top 18 of the die or chip 14 including the adhesively coated pads 16.

In FIG. 2e, the particles or spheres 22 which are not held by the adhesive coating on the pads 16 are removed by tilting or shaking off from the surface 18 of the die 14. This step can be delayed and performed after the bonding step of FIG. 2g if leads 12 are pre-aligned with pads 16.

In FIG. 2f, the electrical leads 12 are aligned over the particles or spheres 22 and the pads 16. Then in the step illustrated in FIG. 2g, a suitable bonder 36 is applied to simultaneously bond the leads 12 to the particles or spheres 22 and to bond the spheres 22 to the electrical pads 16 of the chip 14. The bonder 36 is removed leaving the die 14 with the electrical leads 12 bonded thereto.

Figure 3:
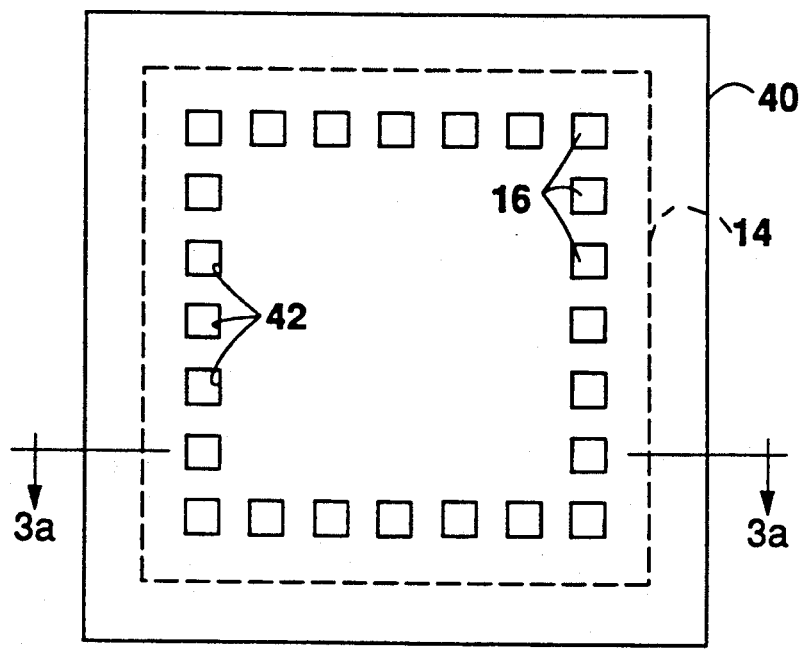
FIG. 3 is an elevational view of the first step of screen printing in another embodiment of bonding leads to a die.
Figure 3A:
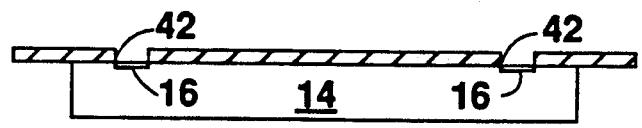
FIG. 3a is a cross-sectional view taken along the line 3a—3a of FIG. 3.
Figure 3B:
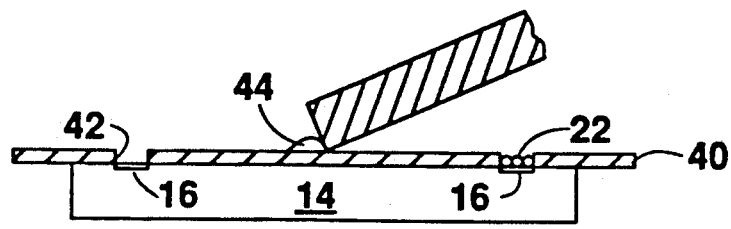
FIG. 3b is a view similar to FIG. 3a showing screen printing a mixture of spheres in a vehicle onto the pads of a die.
Figure 3C:
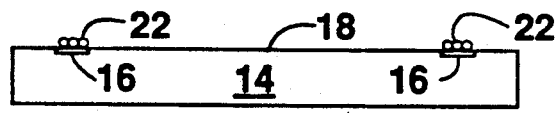
FIG. 3c is a view similar to FIG. 3b with the removal of the screen.
Figure 3D:
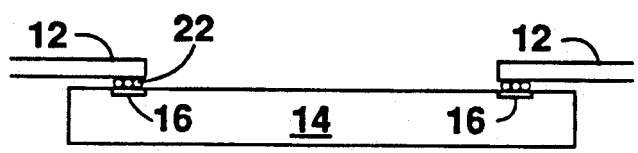
FIG. 3d is a view similar to FIG. 3c with the placement of electrical leads for bonding.
Figure 3E:
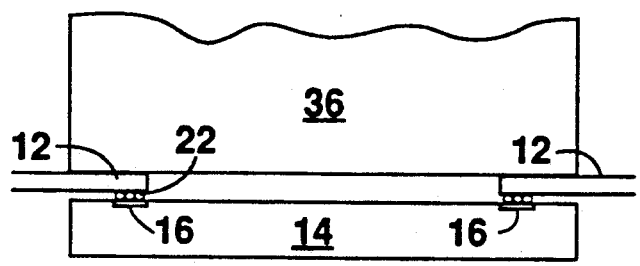
FIG. 3e is a view similar to FIG. 3d showing the bonding of the electrical leads to the particles and the bonding of the particles to the pads.
Figure 3F:
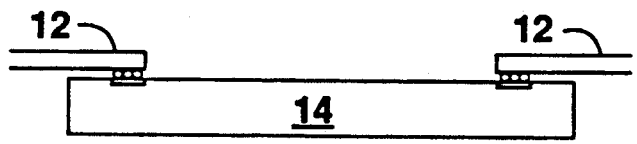
FIG. 3f is a view of the finished product using the bonding process.

Referring now to FIGS. 3 through 3f, a still further embodiment of the present invention is shown wherein the particles or spheres 22 are combined in a vehicle. A vehicle may consist of any material that is thick enough to hold the particles 22 in place on pads 16. Vehicle 22 may or may not decompose and evaporate during bonding depending on the composition of the vehicle and the type of bonding employed. For instance, vehicle 22 will normally evaporate during thermosonic, thermocompression, or laser bonding; however, certain vehicles 22 such as thermoset plastic may not evaporate during adhesive bonding. Suitable vehicles also include an adhesive as previously described, agar jells, glyserol, and rosin-based materials like those used in solder creams. The mixture of the vehicle and particles 22 is then applied to only the pads or contacts 16 of the die or chip 14 by use of a conventional screen printer and a metal mask. Thus, referring to FIGS. 3 and 3a, a conventional screen printer and mask 40 such as a standard AMI printer is used to provide a coating of the particles 22 and the vehicle onto the electrical pads 16 on the top of the chip or die 14 through the openings 42 which are aligned with the pads or contacts 16. As best seen in FIG. 3b, a mixture of vehicle and particles or spheres 22 is applied by the printer through the mask 40 into the openings 42 to deposit the mixture on top of the pads or contacts 16.

Referring to FIG. 3c, the screen printer and mask 40 is removed leaving the vehicle mixture including the particles 22 coated on the pad 16. Again, as best seen in FIG. 3d, the electrical leads 12 which need not be pre-aligned are aligned over the particles 22 and pads 16. In FIG. 3e, a suitable bonder 36 is provided to bond the leads to the particles 22 and the particles 22 simultaneously to the pads 16.

Again, as best seen in FIG. 3f, the finished product is best seen with the leads 12 bonded to the pads 16 of die 14 by way of a single layer of particles 22 therebetween.

Figure 4:
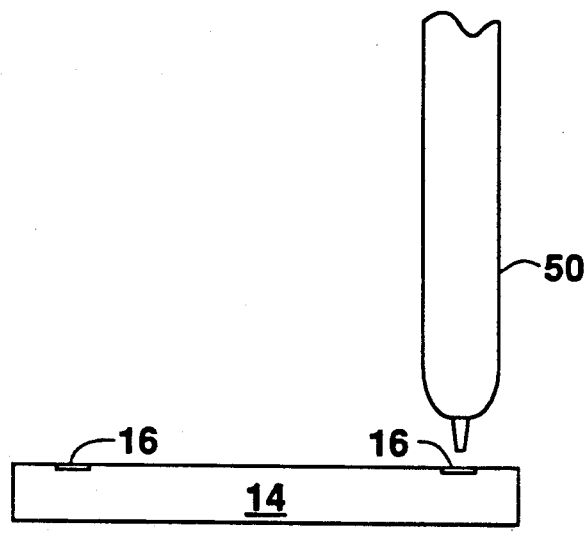
FIG. 4 illustrates another method of adding adhesive or a mixture of a vehicle and conductive particles to the pads of an integrated circuit die for bonding.

Referring now to FIG. 4, a syringe 50 is shown which can be used in one of the foregoing processes for dispensing adhesive and/or a mixture of a vehicle and particles directly onto the pad 16 of a die 14. For example, the syringe 50, filled with only adhesive, could be used in the process of the embodiment of FIGS. 2-2h by substituting the syringe of FIG. 4 for the steps of FIGS. 2a and 2b. That is, the syringe 50 could be used to dispense one of the foregoing mentioned adhesives directly upon the pads 16 to provide the results shown in FIG. 2c. Thereafter, the remainder of the steps of the process would be as shown in FIGS. 2d, 2e, 2f, 2g and 2h.

As a further embodiment, the syringe 50, when used with a mixture of vehicle and particles, could be used in the process of FIGS. 3-3f as a substitute for the steps of FIGS. 3a and 3b. That is, the syringe of FIG. 4 could deposit directly upon the pads 16 as shown in FIG. 3c a mixture of vehicle and particles. Thereafter, the remainder of the process would be as best seen in FIGS. 3d, 3e and 3f.

Figure 5:
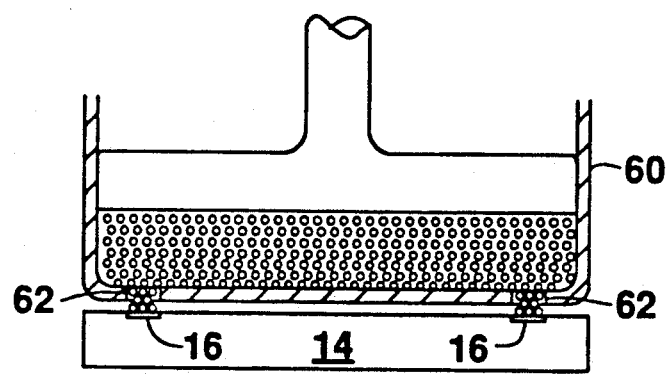
FIG. 5 is a cross-sectional view of still a further method and apparatus for applying an adhesive or a mixture of a vehicle and conductive particles to the pads of a die.

The use of the syringe 50 is useful, but is somewhat slow in attempting to dispense either an adhesive or a mixture of vehicle and particles onto a plurality of pads 16. However, it may be useful in dies or chips 14 which have a differing pattern arrangement of pads 16 thereon, or as a repair or remake process. In use with dies 14 having a uniform pattern arrangement of pads 16, the piston and tube assembly 60 of FIG. 5 may be utilized in place of the syringe 50, either with adhesive or with a mixture of vehicle and particles. The piston and tube assembly 60 would include a plurality of outlets or openings 62 each of which would be positioned to be aligned with one of the pads or contacts 16. Therefore, an adhesive or mixture of vehicle and particles could be applied to and coated to each of the pads 16 prior to alignment of the electrical leads and bonding.

As an alternative to laser, thermosonic, or thermocompression bonding, the embodiments which utilize an adhesive applied to the pads 16, as illustrated by FIGS. 2, 3, 4, and 5, can also have an adhesive applied to the leads 12 prior to bonding. Thereafter, bonder 36 can simultaneously press together pads 16 and particles 22 as well as particles 22 and leads 12 to establish an adhesive bond. The adhesive bonding conditions such as time, temperature, pressure and the like are as required by the particular adhesive used.

The present invention, therefore, is well adapted to carry out the objects and attain the ends and advantages mentioned as well as others inherent therein. While presently preferred embodiments of the invention have been given for the purpose of disclosure, numerous changes in the details of construction and steps of the process will be readily apparent to those skilled in the art and which are encompassed within the spirit of the invention and the scope of the appended claims.

What is claimed is:

1. A method of bonding a first plurality of electrical leads to a second plurality of electrical pads on a top surface of an electronic component, comprising:
   covering each pad with a plurality of electrically conductive particles;
   aligning the electrical leads with the particles and pads, wherein portions of the electrical leads extend beyond the outer periphery of the top surface of the electrical component; and
   simultaneously bonding the particles to the pads and the aligned electrical leads to the particles so that each bonded particle is between and in contact with a pad and a lead.

2. The method of claim 1 wherein the maximum size of the particles is no greater than one-half of the width of the pads.

3. The method of claim 1 wherein the particles are solid spheres.

4. The method of claim 1 wherein the particles are solid right circular cylinders.

5. The method of claim 1 wherein the particles are powder particles.

6. The method of claims 1 wherein prior to bonding the particles extend at least 0.5 mils above the pads.

7. The method of claim 1 wherein prior to bonding the particles extend approximately 0.5 to 1.5 mils above the pads.

8. The method of claim 1, including
   covering the pads with an adhesive material prior to covering the pads with the particles so that the particles will adhere to the pads.

9. The method of claim 1, including
   covering the pads with a mixture of vehicle and particles, wherein the vehicle is thick enough at room temperature to hold the particles in place so that the particles adhere to the pads.

10. The method of claim 8, including
    covering the surface with a mask exposing only the pads prior to covering the pads with an adhesive material.

11. The method of claim 9, including
    covering the surface with a mask exposing only the pads prior to covering the pads with a mixture of vehicle and particles.

12. The method of claim 8, including
    covering the pads with an adhesive material by a syringe.

13. The method of claim 9, including
    covering the pads with a mixture of vehicle and particles by a syringe.

14. The method of claim 8 wherein the pads are simultaneously covered with adhesive by a piston and tube assembly having a plurality of openings in alignment with the pads.

15. The method of claim 9 wherein the pads are simultaneously covered by a mixture of vehicle and particles by a piston and tube assembly having a plurality of openings in alignment with the pads.

16. The method of claim 9 wherein only the pads are covered by a mixture of vehicle and particles by screen printing through a metal mask.

17. The method of claim 8, including
    covering the electrical leads with an adhesive material prior to bonding the electrical leads, and
    bonding the pads and the aligned leads by adhesive bonding.

18. The method of claim 9, wherein
    said vehicle is an adhesive,
    prior to bonding the electrical leads are covered with an adhesive material, and
    the particles are bonded to the pads and the aligned leads by adhesive bonding.

19. The method of claim 9 wherein the vehicle evaporates as bonding occurs.

20. The method of claim 9 wherein the bonding is provided by adhesive bonding and the vehicle fails to evaporate as bonding occurs.

21. The method of claim 20 wherein the vehicle is a thermoset plastic.

22. The method of claim 1 wherein the bonding is by thermocompression bonding.

23. The method of claim 1 wherein the bonding is by thermosonic bonding.

24. The method of claim 1 wherein the bonding is by laser bonding.

25. The method of claim 1 wherein the pads are in and aligned with an essentially smooth top surface of the electrical component.

26. A method of bonding a first plurality of electrical leads to a second plurality of electrical pads on a surface of an electrical component, comprising:
- pre-aligning the electrical leads with the pads;
- covering the surface of the electrical component with a plurality of electrically conductive particles;
- aligning the pre-aligned electrical leads with the particles and the pads;
- simultaneously bonding the particles to the pads and the aligned electrical leads to the particles so that each bonded particle is between and in contact with a pad and a lead; and then
- removing the unbonded particles off the surface of the electrical component.

27. The method of claim 26, including
enclosing the pads and the surface of the electrical component with a retaining lip for holding the particles on the surface prior to bonding.

28. The method of claim 27 wherein the height of the retaining lip is approximately one-half of the diameter of the particles.

29. The method of claim 27 wherein the retaining lip is a flexible metal strip.

30. The method of claim 26 wherein the pads are in and aligned with an essentially smooth top surface of the electrical component.

31. A method of bonding a plurality of electrical leads of a TAB tape to a plurality of electrical contacts on a surface of an integrated circuit die, comprising:
- pre-aligning the leads with the contacts;
- enclosing the contacts and the surface of the die with a retaining lip;
- covering the contacts and the surface within the retaining lip with a single layer of solid electrical particles;
- aligning the pre-aligned leads with the contacts;
- simultaneously bonding the leads to the particles on the contacts and bonding the particles on the contacts so that each bonded particle is between and in contact with a contact and a lead; and then
- removing the unbonded particles from the surface.

32. The method of claim 31 wherein the height of the retaining lip is approximately one-half of the diameter of the particles.

33. The method of claim 31 wherein the particles are solid spheres.

34. The method of claim 33 wherein the solid spheres have a diameter of at least 0.5 mils.

35. The method of claim 31 wherein the particles are solid right circular cylinders.

36. The method of claim 31 wherein the contacts are in and aligned with an essentially smooth top surface of the die.

* * * * *

UNITED STATES PATENT AND TRADEMARK OFFICE
CERTIFICATE OF CORRECTION

PATENT NO. : 5,076,485
DATED      : December 31, 1991
INVENTOR(S): Colin A. MacKay It is certified that error appears in the above-indentified patent and that said Letters Patent is hereby corrected as shown below:

Column 2, line 44, delete "in".

Column 4, line 61, after "pre-align"-- insert leads 12 to pads 16 prior to covering surface 18, since --.

Column 5, line 11, delete "have" and substitute -- having--.

Column 8, claim 6, line 1, delete "claims" and substitute --claim--.

Signed and Sealed this

Seventeenth Day of August, 1993

Attest:

BRUCE LEHMAN

*Attesting Officer*  *Commissioner of Patents and Trademarks*